United States Patent
Doyle et al.

(10) Patent No.: US 8,388,854 B2
(45) Date of Patent: Mar. 5, 2013

(54) METHODS OF FORMING NANODOTS USING SPACER PATTERNING TECHNIQUES AND STRUCTURES FORMED THEREBY

(75) Inventors: Brian Doyle, Portland, OR (US);
Been-Yih Jin, Lake Oswego, CA (US);
Jack Kavalieros, Portland, OR (US);
Robert Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1122 days.

(21) Appl. No.: 11/968,091

(22) Filed: Dec. 31, 2007

(65) Prior Publication Data
US 2010/0285279 A1 Nov. 11, 2010

(51) Int. Cl.
*C23F 1/00* (2006.01)
(52) U.S. Cl. ............... 216/79; 216/39; 216/97; 438/639; 438/723
(58) Field of Classification Search ............ 216/13, 216/39, 75, 79, 80, 97, 99, 11, 37; 438/261, 438/638, 639, 478, 723, 756, 724
See application file for complete search history.

(56) References Cited

U.S. PATENT DOCUMENTS

| 6,274,412 B1 * | 8/2001 | Kydd et al. ............... 438/149 |
| 6,897,098 B2 | 5/2005 | Hareland |
| 7,170,132 B2 * | 1/2007 | Ogura et al. ............... 257/324 |
| 2003/0006410 A1 | 1/2003 | Doyle |
| 2005/0215040 A1 * | 9/2005 | Doyle ........................ 438/585 |
| 2006/0124467 A1 | 6/2006 | Ho |
| 2006/0273376 A1 * | 12/2006 | Weimer et al. ............. 257/321 |

FOREIGN PATENT DOCUMENTS

| KR | 100763897 B1 | 9/2007 |
| WO | 2009/088587 A2 | 7/2009 |
| WO | 2009/088587 A3 | 9/2009 |

OTHER PUBLICATIONS

International Search Report and Written Opinion received for PCT Patent Application No. PCT/US2008/085226, mailed on Jul. 15, 2009, 12 pages.
International Preliminary Report on Patentability received for PCT Patent Application No. PCT/US2008/085226, mailed on Jul. 15, 2010, 6 pages.

* cited by examiner

*Primary Examiner* — Lan Vinh
(74) *Attorney, Agent, or Firm* — Forefront IP Lawgroup, PLLC

(57) ABSTRACT

Methods and associated structures of forming a microelectronic device are described. Those methods may include forming a first block on a nanodot material, forming a first spacer on the first block, removing the first block to form a free standing spacer, removing exposed portions of the nanodot material and then the free standing spacer to form nanowires, forming a second block at an angle to a length of the nanowires, forming a second spacer on the second block, forming a second free standing spacer on the nanowires by removing the second block, and removing exposed portions of the nanowires and then the second free standing spacer to form an ordered array of nanodots.

14 Claims, 6 Drawing Sheets

METHODS OF FORMING NANODOTS USING SPACER PATTERNING TECHNIQUES AND STRUCTURES FORMED THEREBY

BACKGROUND OF THE INVENTION

Nanodots may be utilized in the fabrication of microelectronic devices, such as data storage devices, for example. Nanodots have been fabricated using classical lithographic techniques.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
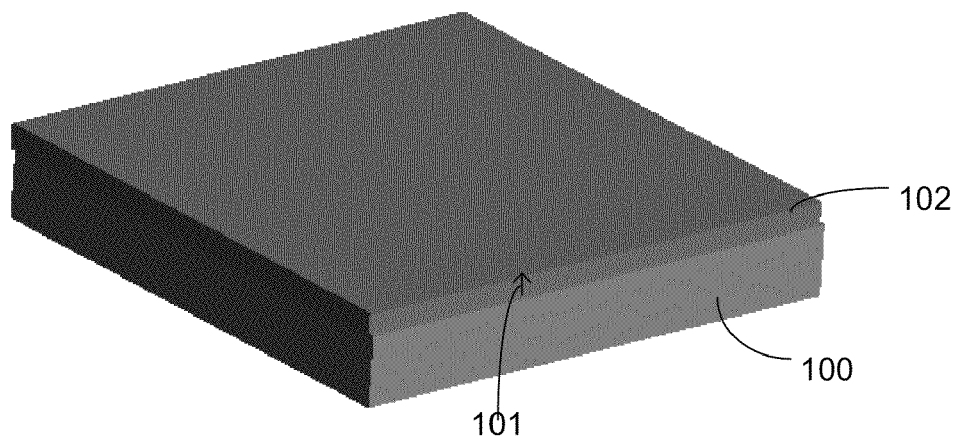
FIGS. 1a-1n represent structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming microelectronic structures are described. Those methods may include forming a first block on a nanodot material, forming a first spacer on the first block, removing the first block to form a free standing spacer, removing the nanodot material in a field area and then the free standing spacer to form nanowires, forming a second block at an angle to a length of the nanowires, forming a second spacer on the second block, forming a free standing spacer on the nanowires by removing the second block, and removing an exposed portion of the nanowires and then the free standing spacer to form an ordered array of nanodots. Methods of the present invention enable the fabrication of ordered rows on nanodots at pitches below those attainable by standard lithographic techniques.

Figure 1B:
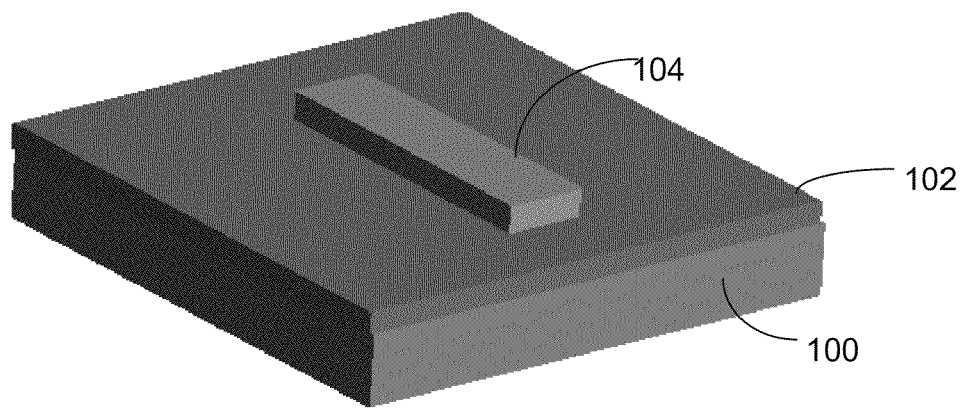
Figure 1C:
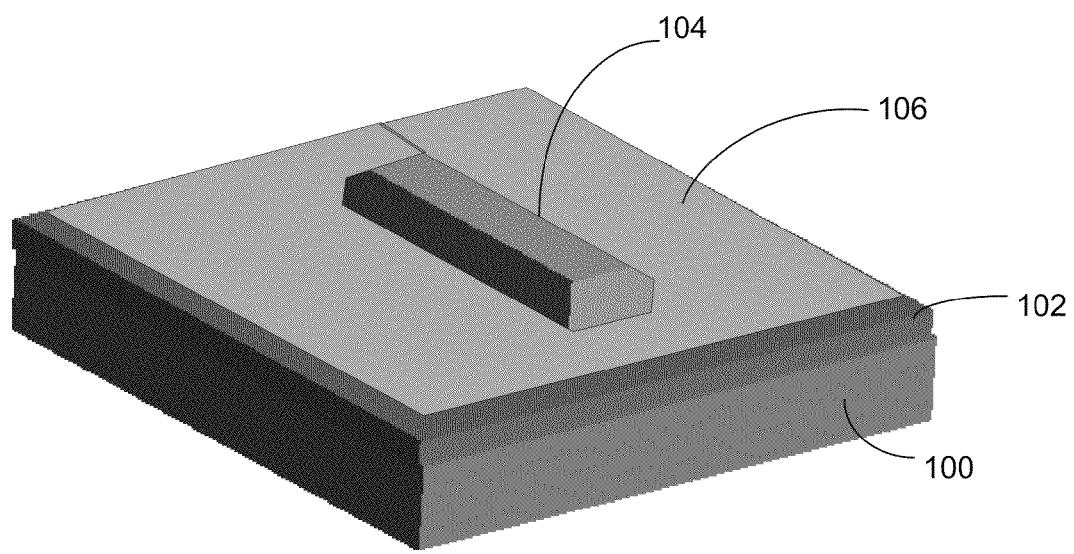
Figure 1D:
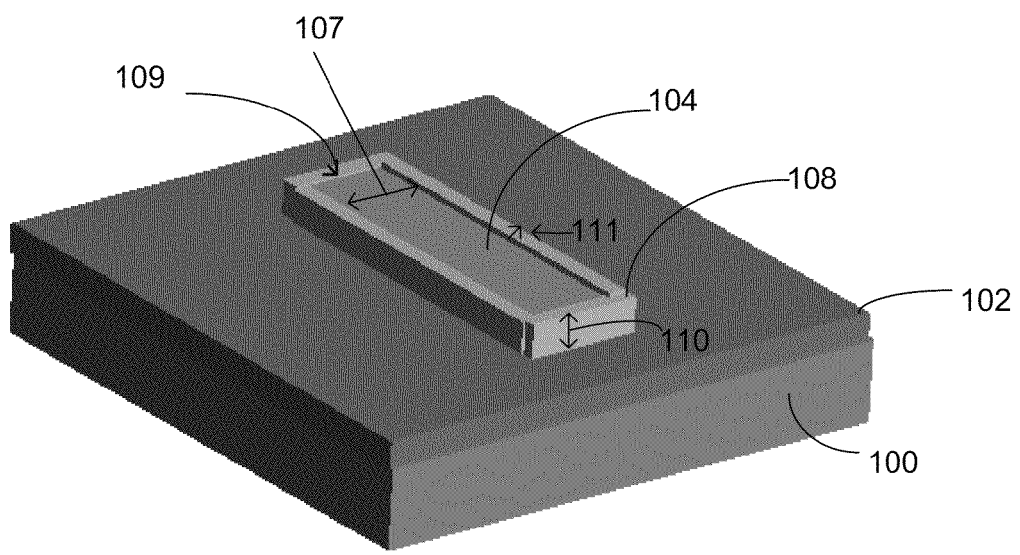
Figure 1E:
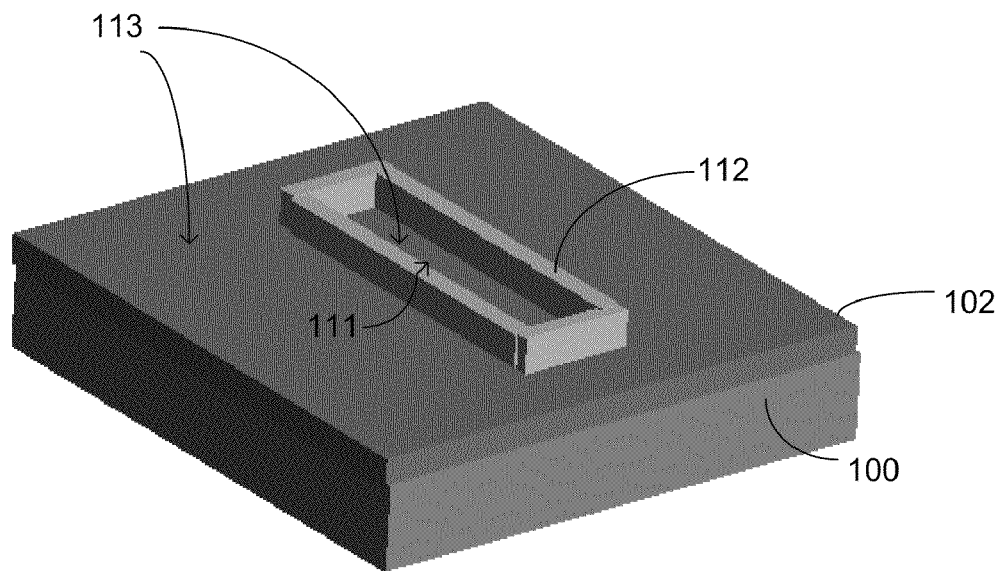
Figure 1F:
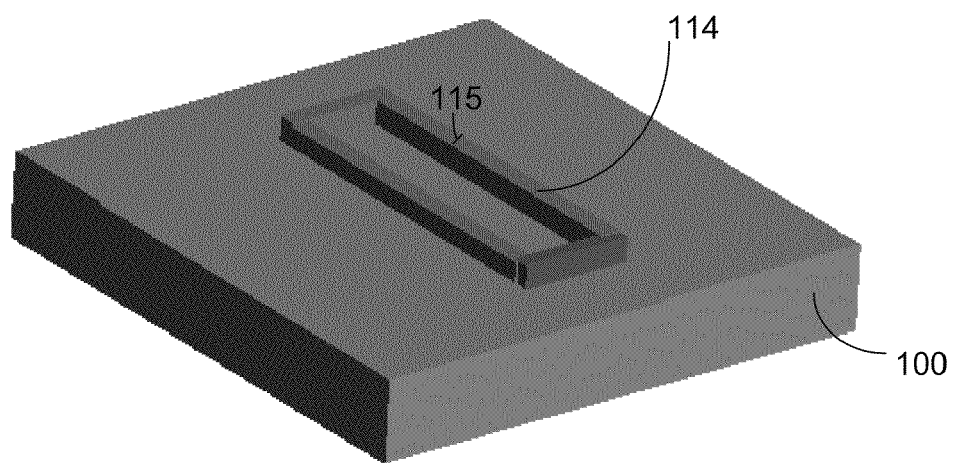
Figure 1G:
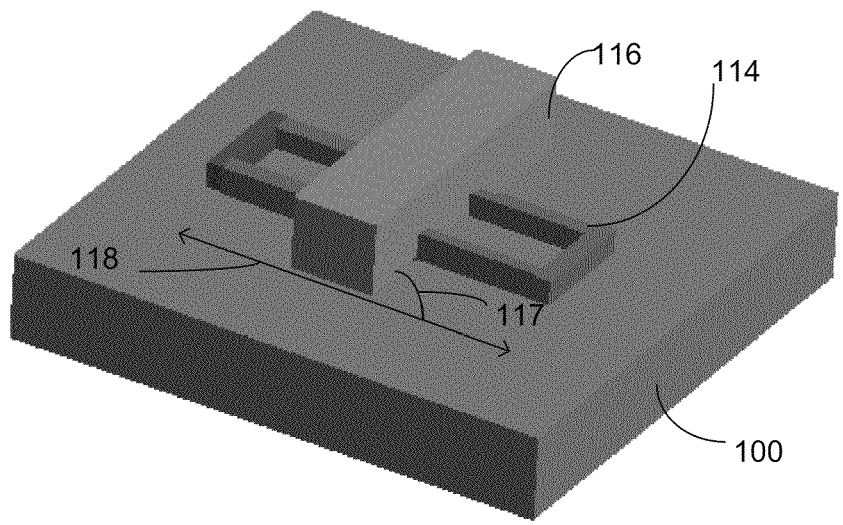
Figure 1H:
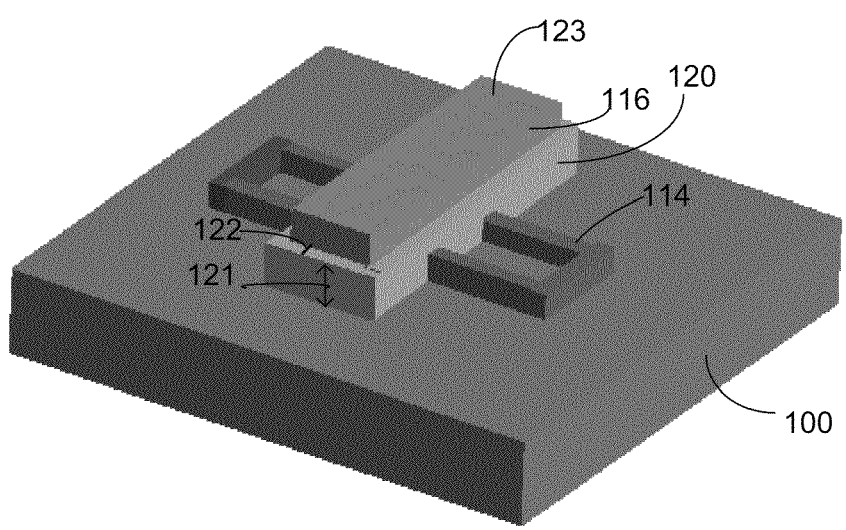
Figure 1I:
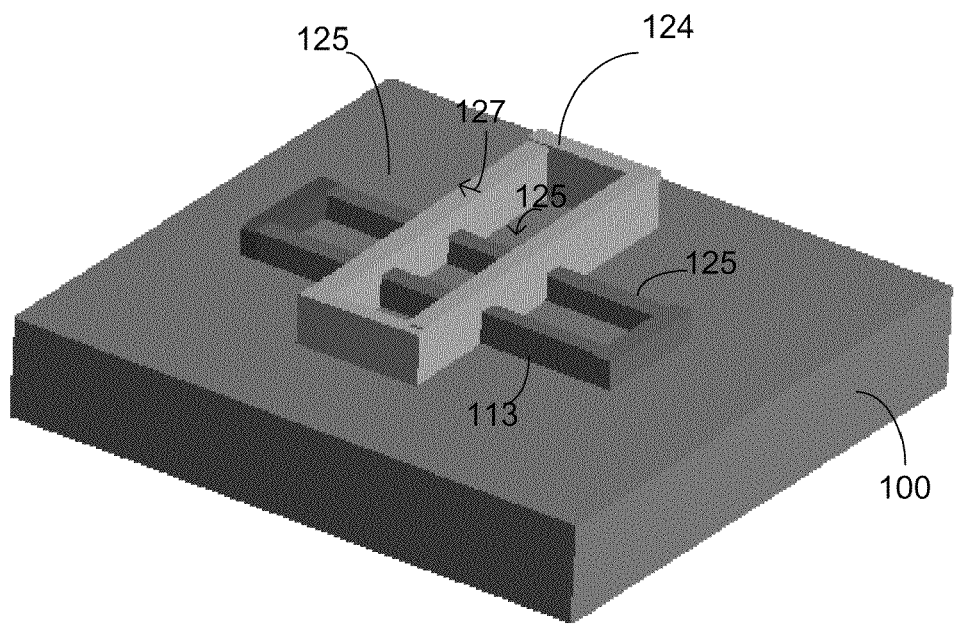
Figure 1J:
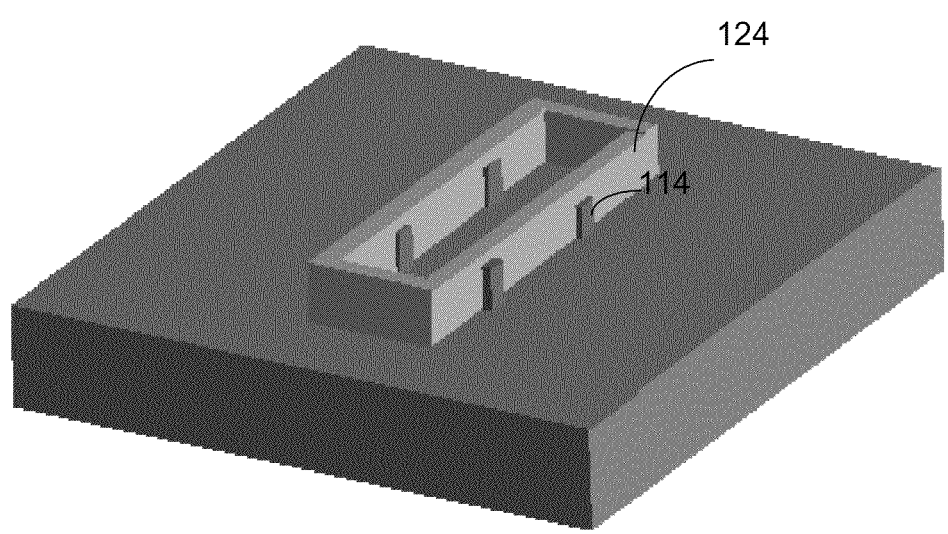
Figure 1K:
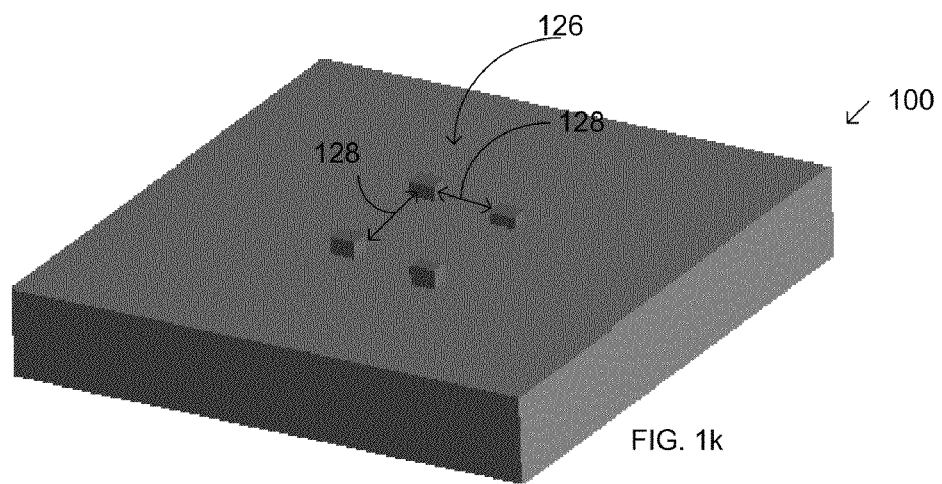
Figure 1L:
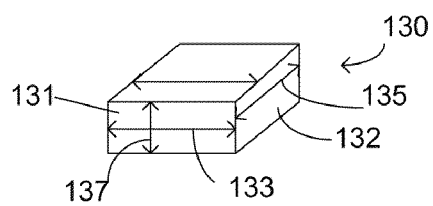
Figure 1M:
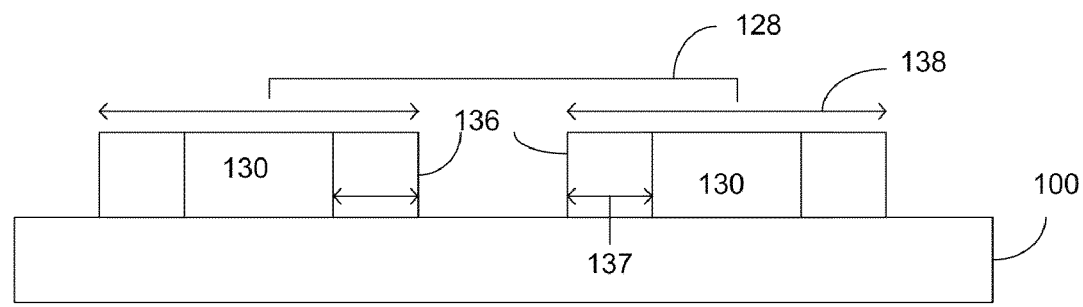
Figure 1N:
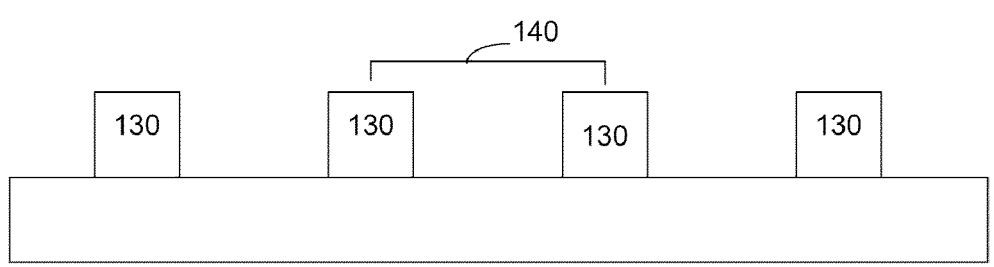

FIGS. 1a-1n illustrate embodiments of methods of forming nanodots, such as may be used in data storage devices, for example. FIG. 1a illustrates a cross-section of a substrate 100. The substrate 100 may comprise a wafer in some embodiments, and may comprise circuitry for memory functions, including but not limited to reading and writing functions, for example. The substrate 100 may comprise silicon in some cases, or any other suitable type of wafer material, depending upon the particular application. Optionally the substrate 100 may comprise an oxidized silicon wafer.

In one embodiment, the substrate 100 may comprise a CMOS microelectronic wafer, which may comprise a diameter suitable for the particular application, such as a diameter of about 12 inches or greater, in some cases. A nanomaterial 104, may be formed on the substrate 100. The nanodot material 102 may comprise any type of nanodot material, may comprise a material such as but not limited to silicon, silicon germanium, germanium, silicon nitride, metal, and/or any material with a band gap and/or offset different to the surrounding medium, such as different from the substrate, for example. In one embodiment, the nanomaterial 102 may comprise a thickness 101 of the nanodot material 102 may comprise about 2 nm to about 100 nm.

A dielectric block 104 may be formed on the nanomaterial 102 (FIG. 1b). The dielectric block 104 may be patterned from a dielectric material, such as a nitride layer and/or a silicon dioxide layer, for example, using available patterning techniques, comprising wet and/or dry etching techniques for example. In one embodiment, the dielectric block 104 may comprise a first block 104, and may comprise an oxide block 104. A dielectric material 106 may be formed on the dielectric block 104 (FIG. 1c). The dielectric material 106 may comprise a nitride and/or an oxide material in some embodiments. The dielectric material 106 may be formed by utilizing a chemical vapor deposition (CVD) process in some embodiments. The dielectric material 106 may comprise a material that is highly etch selective to the material comprising the dielectric block 104.

For example, the dielectric block 104 may comprise one of a nitride and an oxide material in on embodiment, and the dielectric material 106 may comprise the other of the nitride and oxide material. In one embodiment, the dielectric material 106 may be patterned to form a spacer 108 that may comprise a first spacer 108 in some embodiments (FIG. 1d). The dielectric material of the spacer 108 may comprise a thickness 110, which may comprise about 20 nm and below in some embodiments.

In one embodiment, the spacer 108 may be patterned by removing the dielectric material 106 from the nanodot material 102 adjacent the dielectric block 104, and from a top portion 107 of the dielectric block 104 by utilizing a dry etching process, for example. In one embodiment, the dry etch may comprise an anisotropic etch, such as a reactive ion etch (RIE). In one embodiment, the spacer 108 may cover an outer portion 109 of the oxide block 104. In one embodiment, the outer portion 109 of the oxide block 104 may comprise a width 111 which may be about 1 to about 20 nm.

The dielectric block 104 may be removed from the nanodot material 102 by utilizing a wet etch, for example to form a free standing spacer 112 (FIG. 1e). In one embodiment, the free standing spacer 112 may comprise a first free standing spacer 112. Exposed portions 113 of the nanomaterial 102 adjacent the free standing spacer 112 may be removed using any suitable etch (FIG. 1f). The free standing spacer material 112 may then be removed from the underlying nanodot material 102, using any suitable etch process. The underlying nanomaterial 102 may comprise nanowires 114 that may be formed/exposed from removing the free standing spacer 112 and exposed portions 113 of the nanomaterial 102. The free standing spacer 112 acts as a mask for the formation of the nanowires 114. The width 111 of the free standing spacer 112 may determine a thickness 115 of the nanowires 114. The nanowires 114 may comprise a thickness 115 of about 20 nm or less in some embodiments.

A second dielectric block 116 may be formed at an angle 117 to a length 118 of the nanowires 114 (FIG. 1g). In one embodiment, the second dielectric block 116 may comprise similar materials as the first dielectric block 104, such as oxide and/or nitride materials. The second dielectric block 116 may comprise an orthogonal block 116 in some applications. The angle 117 in relation to the length 118 of the nanowires 114 may comprise a substantially orthogonal angle, in some embodiments, but the angle 117 may vary according to the particular application. In one embodiment, the second block 117 may be formed from a dielectric material, such as a nitride layer and/or a silicon dioxide layer, for example, that may be patterned using available patterning techniques, comprising wet and/or dry etching techniques for example.

In one embodiment, a second dielectric material (that may be formed by utilizing a (CVD) process in some embodiments) may be formed on the second dielectric block 116, the nanowires 114 and on the substrate 100 and may be patterned to form a second spacer 120 (FIG. 1h). In one embodiment, the second spacer 120 may comprise a width 122 and a thickness 121, which may comprise about 20 nm and below in some embodiments. The second spacer 120 may be patterned by removing the second dielectric material from the nanowires 114 adjacent the second dielectric block 116, and from a top portion 123 of the second dielectric block 116 by utilizing a dry etching process, for example. In one embodiment, the dry etch may comprise an anisotropic etch, such as a reactive ion etch (RIE).

The second spacer 120 may comprise a nitride and/or an oxide material in some embodiments. The second spacer 120 may comprise a material that is highly etch selective to the material comprising the second dielectric block 116. In one embodiment the second spacer 120 may comprise an orthogonal spacer 120.

The second dielectric block 116 may be removed from the substrate 100 by utilizing a wet etch, for example to form a second free standing spacer 124 (FIG. 1i). In one embodiment, the second free standing spacer 124 may comprise a second free standing spacer 124 or an orthogonal free standing spacer 124 that may comprise a width 127. Exposed portions 125 of the nanowires 114 adjacent the second free standing spacer 124 may be removed using any suitable etch (FIG. 1j). The second free standing spacer 124 may then be removed from the underlying nanowires 114 using any suitable etch process to form an ordered array of nanodots 126 disposed on the substrate 100 (FIG. 1k).

In one embodiment, individual nanodot 130 of the ordered array of nanodots 126 may comprise a first side 131 and a second side 132 (FIG. 1l). The individual nanodot 130 may comprise a first side length 133 and a second side length 135. At least one of the first and the second side length 133, 135 may comprise about 50 nm or below, in some embodiments. A pitch 128 between adjacent individual nanodots 130 (referring back to FIG. 1k) may comprise about 20 nm and below. In one embodiment, a thickness 137 of the individual nanodot 130 may comprise about 20 nm and below.

The exact dimensions, geometries and pitches of the nanodots may vary depending upon the particular application, and can comprise any shape suitable for the application. The width 111 of the first spacer 112 and the width 127 of the second spacer 124 may determine the lengths 133, 135 of the first side and the second side 131, 133 of an individual nanodot 130. In some embodiments, the first and second sides may be of the same length, and in other embodiments, they may be of different lengths to each other, depending upon the desired widths of the first and second spacers 112, 124 for the particular application.

In another embodiment, the pitch could be made successively tighter between adjacent individual nanodots for a given array of nanodots by repeating the spacer lithography technique (FIG. 1b-FIG. 1e above), i.e., depositing a second spacer material on the spacers of FIG. 1e, etching this material to form a second set of spacers on the sidewalls of the original spacer (which are now removed), whose pitch is now halved with respect to the first spacer system. This can be repeated in both x-direction (FIG. 1c-FIG. 1f) and y- (FIG. 1g-FIG. 1i) direction. In one embodiment, a spacer 136, which may comprise such materials as a dielectric material, for example, may be formed on individual nanodots 130 disposed on a substrate 100 (FIG. 1m), that may comprise a first pitch 128 between adjacent nanodots 130. The spacer 136 may comprise a thickness 137, which may comprise a thickness that is less than a thickness 138 of the nanodot 130.

The exposed portions of the nanodots 130 may be removed (those portions not covered by the spacer 136) using suitable anisotropic etching techniques, and then the spacer 136 may be removed from the underlying nanodots 130 (FIG. 1n). A second pitch 140 may be achieved between adjacent nanodots 130 that may be smaller than the first pitch 128. The process of utilizing spacer lithography may be repeated until a desired feature pitch is obtained.

Thus, benefits of the present invention include taking advantage of a spacer lithography approach to first print nanowires at less than minimum lithographic pitch, and then using the same spacer lithographic approach to print structures orthogonal to the first spacers, and patterning to form nanodots. The use of spacer patterning enables the definition of nanodots at half the minimum pitch available with conventional lithographic techniques. Another advantage is the ability to place an array of nanodots in an ordered fashion at separations below that which are attainable by conventional lithographic techniques.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic devices, such as memory related structures, are well known in the art. Therefore, it is appreciated that the Figures provided herein illustrate only portions of an exemplary microelectronic device that pertains to the practice of the present invention. Thus the present invention is not limited to the structures described herein.

What is claimed is:
1. A method comprising:
   forming a nanodot material on a substrate;
   forming an oxide block on the nanodot material;
   forming a nitride film on the substrate;
   patterning the nitride film to form a nitride spacer;
   removing the oxide block to form a free standing nitride spacer
   removing exposed portions of the nanodot material and then the free standing nitride spacer to form nanowires;
   forming an orthogonal oxide block at a substantially orthogonal angle to a length of the nanowires;
   forming an orthogonal nitride spacer on the orthogonal oxide block;

removing the orthogonal oxide block to form an orthogonal free standing nitride spacer; and removing an exposed portion of the nanowires and then the orthogonal free standing nitride spacer to form an ordered array of nanodots on the substrate.

2. The method of claim 1 wherein nanodot material comprises at least one of silicon, silicon germanium, germanium, silicon nitride, metal, and a material comprising a band gap different from the substrate.

3. The method of claim 1 wherein patterning the nitride film to form a nitride spacer comprises:

removing the nitride film from the nanodot material adjacent to the oxide block by utilizing a dry etching process; and removing the oxide block by utilizing a wet etch.

4. The method of claim 1 further comprising wherein the nanowires comprise the nanomaterial.

5. The method of claim 1 wherein the substrate comprises an oxidized silicon substrate.

6. The method of claim 1 wherein forming the nitride spacer further comprises wherein the nitride spacer covers an outer portion of the oxide block but does not cover a top portion of the oxide block.

7. The method of claim 1 further comprising wherein a pitch between adjacent nanodots comprises less than about 10 nm.

8. The method of claim 1 further comprising wherein a thickness of the nitride spacer and a thickness of the orthogonal nitride spacer determines at least one of a side length of the nanodot.

9. A method comprising:

forming a first block on a nanodot material;

forming a first spacer on the first block;

removing the first block to form a first free standing spacer;

removing exposed portions of the nanodot material and then the first free standing spacer to form nanowires;

forming a second block at an angle to a length of the nanowires;

forming a second spacer on the second block;

forming a second free standing spacer on the nanowires by removing the second block; and removing exposed portions of the nanowires and then the second free standing spacer to form an ordered array of nanodots.

10. The method of claim 9 further comprising wherein a pitch between adjacent nanodots comprises less than about 10 nm.

11. The method of claim 9 further comprising wherein the first and second block comprise a dielectric material.

12. The method of claim 11 further comprising wherein the first spacer and the second spacer comprise a material that is selective to the dielectric material.

13. The method of claim 9 further comprising wherein nanowires comprise the nanodot material.

14. The method of claim 9 wherein the nanodot material comprises at least one of silicon, silicon germanium, germanium, silicon nitride, metal, and any material comprising a band gap different from the substrate.

* * * * *